(12) United States Patent
Pilkington

(10) Patent No.: US 7,109,874 B2
(45) Date of Patent: Sep. 19, 2006

(54) SMOKE DETECTORS

(75) Inventor: David James Pilkington, Shevington (GB)

(73) Assignee: Acbond Limited, (GB)

( * ) Notice: Subject to any disclaimer, the term of this patent is extended or adjusted under 35 U.S.C. 154(b) by 107 days.

(21) Appl. No.: 10/472,009

(22) PCT Filed: Mar. 11, 2002

(86) PCT No.: PCT/GB02/01100

§ 371 (c)(1),
(2), (4) Date: Mar. 17, 2004

(87) PCT Pub. No.: WO02/073558

PCT Pub. Date: Sep. 19, 2002

(65) Prior Publication Data

US 2004/0145483 A1   Jul. 29, 2004

(30) Foreign Application Priority Data

Mar. 10, 2001 (GB) ................................. 0106273.6
Mar. 17, 2001 (GB) ................................. 0106647.1

(51) Int. Cl.
*G08B 17/10* (2006.01)

(52) U.S. Cl. .............. 340/628; 340/693.9; 340/693.11; 340/632; 340/634

(58) Field of Classification Search ...................... None
See application file for complete search history.

(56) References Cited

U.S. PATENT DOCUMENTS

| | | | |
|---|---|---|---|
| 3,799,670 A | * 3/1974 | Kohr | ........................ 356/439 |
| 4,090,178 A | 5/1978 | Norris | |
| 4,092,641 A | * 5/1978 | Bellinghausen et al. | .... 340/521 |
| 4,155,746 A | 5/1979 | McKendry et al. | |
| 4,199,754 A | 4/1980 | Johnson et al. | |
| 4,257,039 A | * 3/1981 | Webb et al. | ................. 340/629 |
| 4,694,285 A | 9/1987 | Scripps | |
| 4,717,910 A | 1/1988 | Scripps et al. | |
| 4,812,827 A | 3/1989 | Scripps | |
| 5,021,677 A | * 6/1991 | Igarashi et al. | ............. 250/574 |
| 5,425,582 A | * 6/1995 | Asano et al. | ................ 374/208 |
| 6,057,778 A | * 5/2000 | Davidson | ................. 340/693.5 |
| 6,377,182 B1 | * 4/2002 | Devine et al. | .............. 340/628 |

FOREIGN PATENT DOCUMENTS

| | | |
|---|---|---|
| EP | 0 346 152 | 12/1989 |
| GB | 2 008 871 | 6/1979 |
| GB | 2 221 074 | 1/1990 |
| GB | 2 221 331 | 1/1990 |
| GB | 2 267 594 | 8/1993 |
| GB | 2 189 634 | 10/1997 |
| WO | WO 90/01201 | 2/1990 |
| WO | WO 99/19666 | 4/1999 |
| WO | WO 00/22588 | 4/2000 |

OTHER PUBLICATIONS

Independent International Search Report.

* cited by examiner

*Primary Examiner*—Benjamin C. Lee
*Assistant Examiner*—Son Tang
(74) *Attorney, Agent, or Firm*—Thompson Coburn LLP

(57) ABSTRACT

A smoke detector unit (20) comprising a housing containing a smoke detector (24) and at least two component mounting boards, such as printed circuit boards, in a stacked arrangement, the housing having at least one air gap (34), wherein one of the boards (36) is inverted with respect to the other and the detector is positioned on the lower board whereby, in use, the detector extends upwardly between the boards. The housing may be in the form of a ceiling rose.

31 Claims, 7 Drawing Sheets

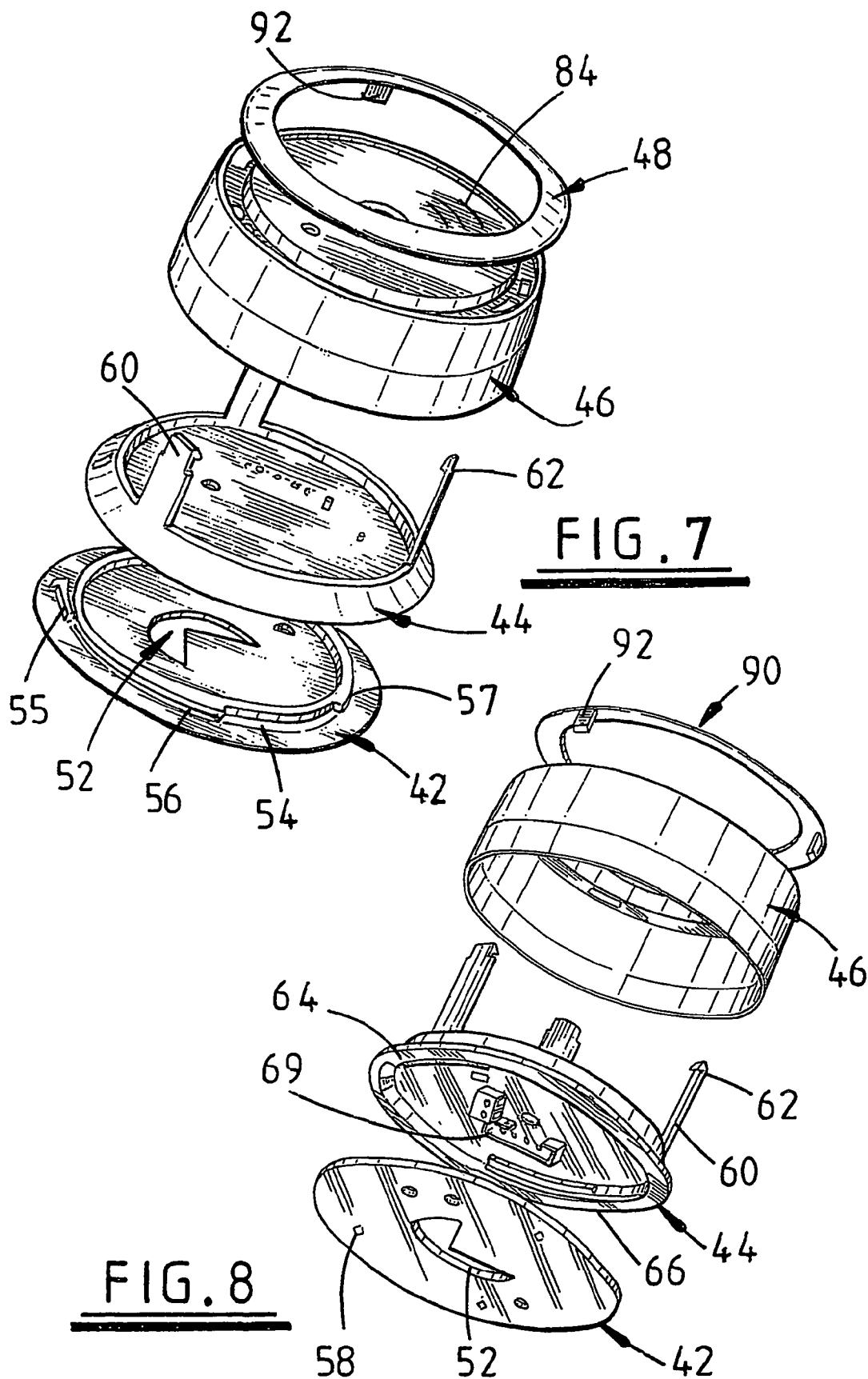

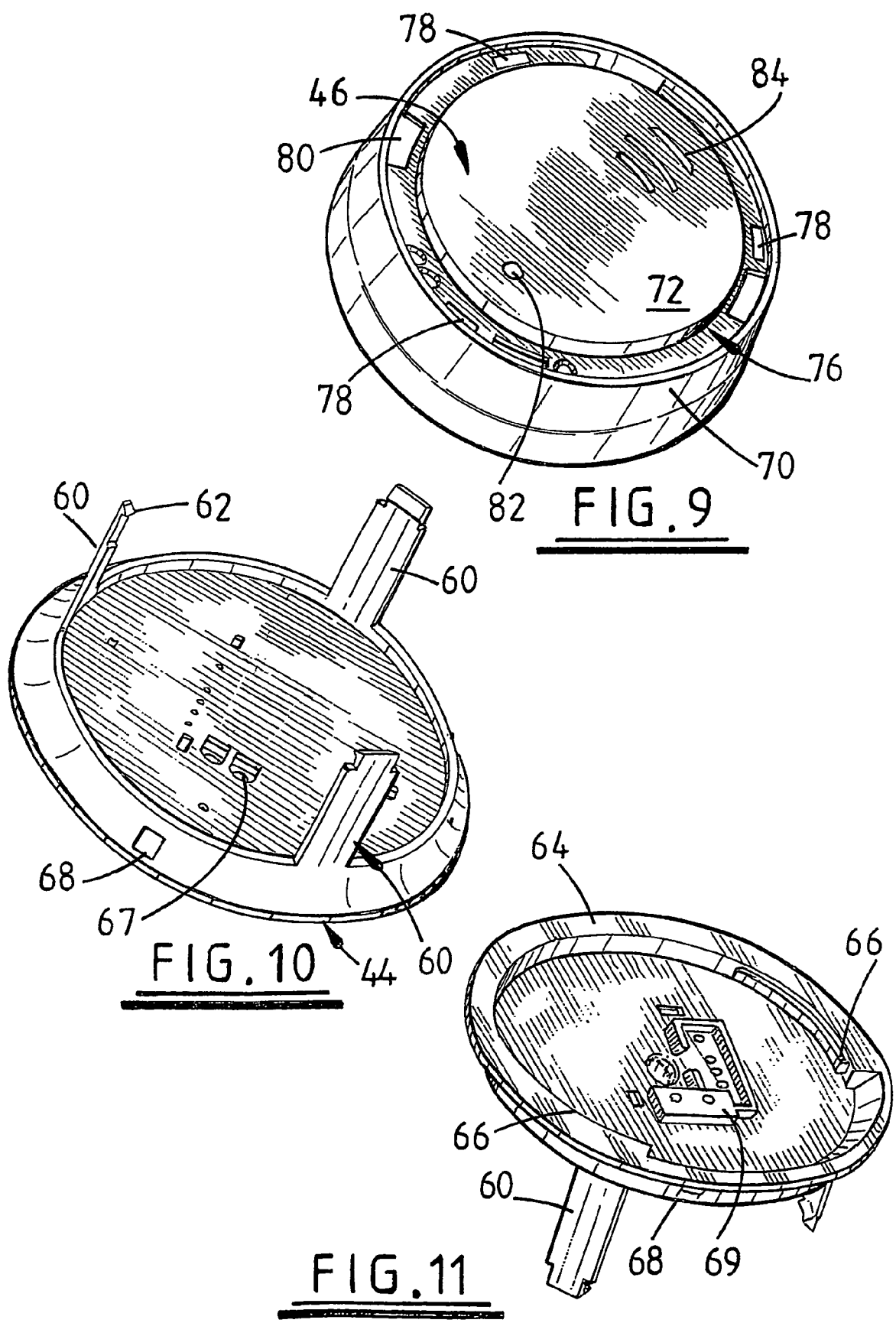

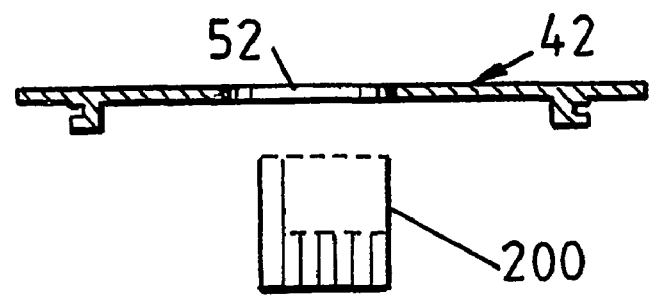
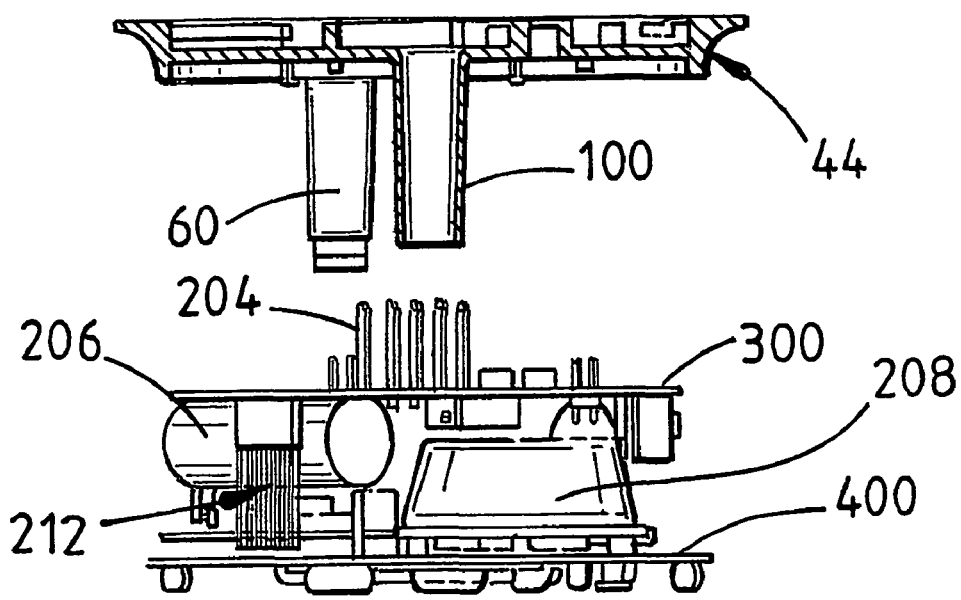
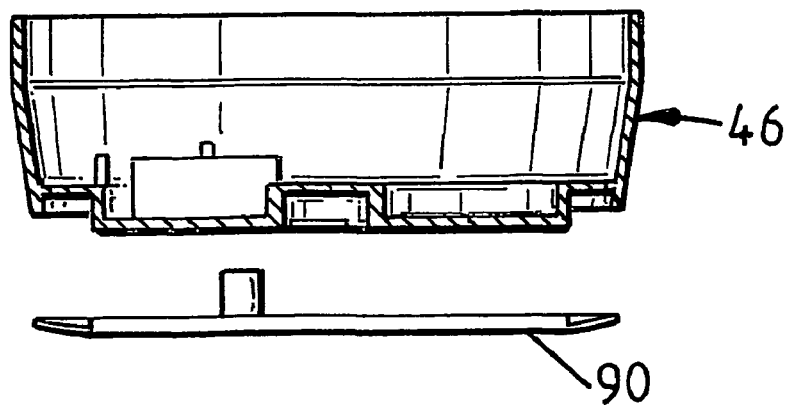
FIG. 19

SMOKE DETECTORS

The present invention relates to an improved smoke detector, particularly but not exclusively a smoke detector for use in domestic situations.

It is known to provide a smoke detector within a housing for attachment to a ceiling, the housing containing a smoke chamber together with the necessary control unit, power supply and sounder to alert the occupants of a possible fire in the event that smoke is detected. However, such housings tend to be of a relatively large size in order to accommodate the components, in particular the smoke chamber, which results in the unit being detrimental to the decor of the building. This also prevents additional components being included in the unit, for example to allow them to function as a ceiling rose or to incorporate, say, the components for an emergency light or other type of detector. In the case of a ceiling rose, the requirement for a central wire to pass through a circular unit means that the largest component, usually the smoke detector, dictates the minimum diametric size of the unit. Thus, following the conventional teaching, providing for multiple functions would only serve to increase the size of the unit further. As a result, although a number of earlier documents dating back many years, such as GB 2189634 (Lawrence Benson), U.S. Pat. No. 4,090,178 Elwood G. Norris) and U.S. Pat. No. 4,717,910 Keith A. Scripps et al) disclose the general concept of providing a combined ceiling rose and smoke detector, such articles are still not available in the marketplace due to earlier investigations failing to overcome the problem of how to produce a unit that is of approximately the same size as a conventional ceiling rose. The articles that have been provided previously are still far larger than the standard type of ceiling rose that is installed in the majority of domestic housing causing the modified ceiling roses to be detrimental to the decor of the house. Hence, such articles have not been widely used domestically.

Thus, to date, an acceptable ceiling rose combined with a smoke detector has not been available. It would be desirable to provide a satisfactory article to assist in persuading a person to install such a device or devices in their home thereby improving the safety of the home for the occupants thereof.

Furthermore, standard domestic smoke detectors require smoke to accumulate to a significant level before the smoke detector present in the housing is activated, thereby raising the alarm. It would be beneficial if a unit could be produced that raises the alarm at a lower level of smoke accumulation.

It is an object of the present invention to provide an improved smoke detector unit that aims to overcome, or at least alleviate, the abovementioned drawbacks.

It is a further object of the present invention to provide an improved combined ceiling rose and smoke detector that aims to overcome, or at least alleviate, the abovementioned drawbacks.

Accordingly, a first aspect of the present invention provides a smoke detector unit, the unit comprising a housing containing a smoke detector and at least two component mounting boards in stacked arrangement, the housing having at least one air gap, wherein one of the boards is inverted with respect to the other and the detector is positioned on the lower board whereby, in use, the detector extends upwardly between said boards.

The inverted stacked arrangement of the component mounting boards provides a reduction in the size of unit. The smoke detector is preferably in the form of a smoke chamber having tapered sides. Further functional accessories would be included within the housing, as required, such as a sounder, control circuit and power supply (such as a battery).

The components mounted on the mounting boards are preferably arranged to achieve maximum utilization of the space provided on and between the component mounting boards, thereby enabling further miniaturization of the unit. It is to be appreciated that the components should be arranged in such a manner as to allow air to flow through the unit.

The component mounting boards preferably comprise printed circuit boards (PCBs). More preferably, the smoke detector and sounder are provided on opposing PCBs.

Preferably, the housing is attachable to a surface, such as a ceiling, via a base plate that may be fastened to the ceiling. Preferably, the housing is in the form of a truncated cylinder closed by a circular bridging member. The base plate is preferably a circular plate of a similar diameter to the housing.

Preferably, one of the printed circuit boards (PCBs) is attached to the base plate and the other PCB is attached to the bridging member of the housing whereby, when the housing and base plate are fastened together, the PCBs are in a parallel, stacked arrangement with the smoke detector located on the PCB attached to the bridging member.

The housing and baseplate may be connected by any suitable means but preferably screw together. More preferably, the housing and baseplate are attached by means of a bayonet fixing. More preferably still, one of the parts is provided with a retaining barb that fits into a complimentary slot or recess provided in the other part, thereby enabling the two parts to be locked together.

Preferably, an air gap is provided between the upper edges of the housing and the base plate to allow air to enter the interior of the housing.

In an alternative embodiment of the present invention, the housing may comprise a cover and a mounting plate, the mounting plate being attachable to the base plate. Preferably, the mounting plate supports the component mounting boards in a stacked arrangement, the boards having the required functional accessories thereon. More preferably, the mounting plate has legs extending therefrom which allow the PCBs to be supported in a stacked arrangement, the smoke detector being located on the PCB furthest from the plate. Preferably, the mounting plate may be encased by the cover to protect the contents thereof. Preferably, the mounting plate is a circular plate and the cover is in the form of a cup-shaped unit that fits over the plate. The mounting plate and cover are preferably sealed together to prevent access being gained to the components of the housing. Preferably, the air gap is provided between the sides of the plate and the upper edges of the cover.

In a preferred embodiment of the present invention, the housing or cover is also provided with a transparent region whereby an emergency light may be contained within the unit and may shine through the transparent region upon activation thereof. Preferably, the transparent region is in the form of a transparent ring that extends around the periphery of the cover. Further components may be included within the unit to provide a multi-functional device, such as a carbon monoxide detector, heat detector and/or intruder detector.

The housing may be in the form a ceiling rose. Preferably, a central hollow shaft is provided through the housing for passage of the cable for the mains light that depends from a ceiling rose.

Accordingly, a second aspect of the present invention provides a combined ceiling rose and smoke detector unit, the unit comprising a housing in the form of a ceiling rose, the housing containing a smoke detector and at least two component mounting boards in stacked arrangement, the housing having at least one air gap, wherein one of the boards is inverted with respect to the other and the detector is positioned on the lower board whereby, in use, the detector extends upwardly between said boards.

The appropriate electrical wiring for the functional accessories and/or the mains light may be provided on or within the base plate for connection to conventional mains wiring that extends from the ceiling. Alternatively, the appropriate wiring may be contained within the housing. More preferably, the outer side of the mounting plate is provided with wiring connections and the base plate is preferably provided with an aperture for passage of these wires but is free from any wiring connections.

To this end, a third aspect of the present invention provides an electrical accessory comprising a housing with a mounting plate, the plate being connectable to a baseplate for mounting to a surface wherein electrical connections are provided in the housing and the baseplate is provided with an aperture therethrough for passage of wiring to said electrical connections.

The housing preferably comprises a mounting plate and cover. Preferably, the electrical connections are provided on the mounting plate and electrical wiring therefrom extends from the mounting plate into the cover and is retained therein. Preferably, electrical pins or terminals extend from the mounting plate for connection to a complimentary socket provided at the ends of the wiring.

A fourth aspect of the present invention provides an electrical accessory comprising at least one detector for detecting a potential hazard, the detector being in communication with a mains light fitting whereby detection of a hazard switches on the mains light.

The detector may detect any type of potential hazard by means of an appropriate sensor. For example, the detector may be a smoke, gas and/or heat detector. Alternatively or additionally, the detector may be in the form of an intruder detector, e.g. in the form of infra-red sensors and/or video-surveillance cameras.

Alternatively or additionally, the detector may be one that detects a malfunction in one or more of the other potential hazard detectors. It is to be appreciated that more than one detector would need to be included in this type of accessory. For example, a smoke detector may be provided in an accessory with additional means for detecting if the smoke detector is no longer working e.g. due to battery failure, which activates the mains light to alert the occupants that the battery requires replacement.

Preferably, the mains light remains on for as long as the hazard is detected, for example, for as long as smoke is detected or until a malfunctioning detector is repaired. The mains light may flash for a predetermined number of seconds prior to being switched on continuously.

It is preferable to provide an emergency light that is activated upon failure of the mains light. For example, if there is a power failure or fire in the building burns out the mains light power supply, an emergency light is automatically activated instead of the mains light. Preferably, the emergency light also forms part of a ceiling rose from which the mains light depends. It is preferable for the accessory to also include a detector for activating the mains light at any time should the emergency light be inoperable.

The detectors may communicate with the mains light and/or emergency light through any appropriate means, such as hard-wiring, a centralised computer system and/or radio waves, such as FM-technology A system of such electrical safety accessories may be provided throughout a building whereby detection of a hazard by at least one of the detectors switches on a mains light.

Yet a further aspect of the present invention provides an electrical accessory comprising at least one detector for detecting a potential hazard, the detector being in communication with an intruder alarm panel whereby detection of a hazard by the electrical accessory activates the intruder alarm and/or detection of an intruder by the intruder alarm activates an alarm provided in the electrical accessory. Preferably, activation of the alarm in the electrical accessory also results in the mains light being switched on.

The electrical accessory may also be linked to a telephone line whereby, upon detection of a hazard, such as fire, a preselected telephone number is dialed, such as that of the appropriate emergency service.

For a better understanding of the present invention and to show more clearly how it may be carried into effect, reference will now be made by way of example only to the accompanying drawings in which:

FIG. 7 is an exploded view from above of the smoke detector unit shown in FIG. 6;

FIG. 8 is an exploded view from below of the smoke detector unit shown in FIG. 6;

FIG. 9 is a perspective view from above of one of the component parts of the smoke detector unit shown in FIG. 6;

FIGS. 10 and 11 are respectively a top and bottom perspective view of a further component part of the smoke detector unit shown in FIG. 6;

FIG. 19 is an exploded side view of the smoke detector unit of FIGS. 16 to 18, having the functional components included therein.

Figure 1:
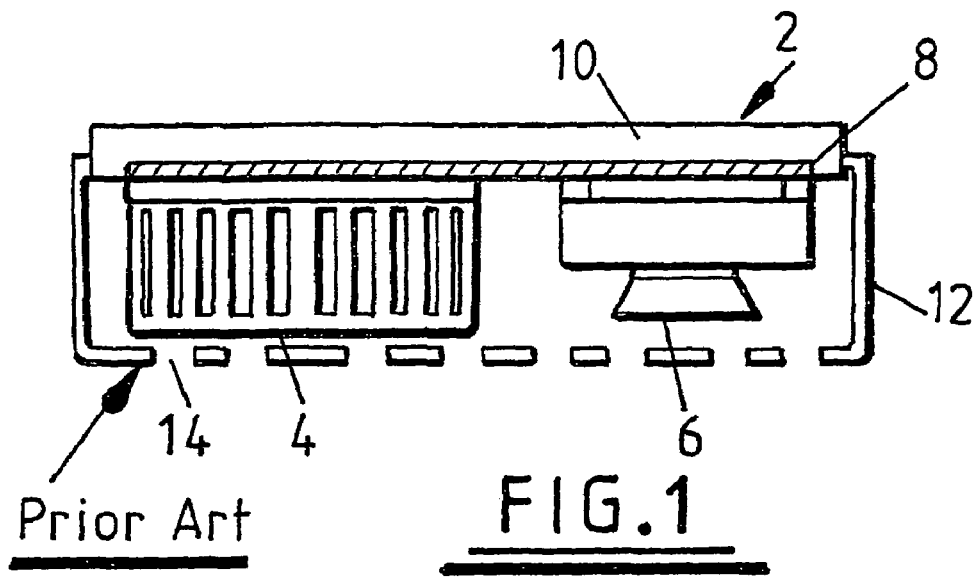
FIG. 1 is a cross sectional view through a conventional smoke detector unit.
Figure 2:
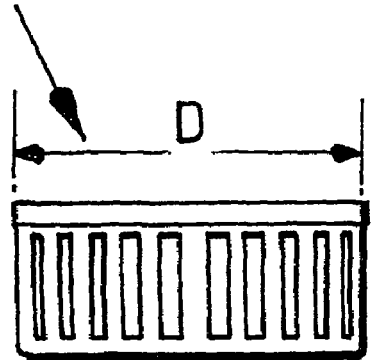
FIG. 2 is a side view of the smoke chamber included in the smoke detector unit of FIG. 1.

Referring to FIGS. 1 and 2 of the accompanying drawings, a conventional smoke detector unit 2 with a smoke chamber 4 is illustrated. The smoke chamber 4, sounder 6, control circuit and power supply are mounted on a single printed circuit board 8 that is secured to a base component 10. A cover 12 is connectable to the base component having air gaps 14 provided in the base of the cover to allow air to flow through the unit for detection of smoke. However, these types of unit are unsightly due to their large size being dictated by the dimensions and layout of the components within the unit.

Figure 3:
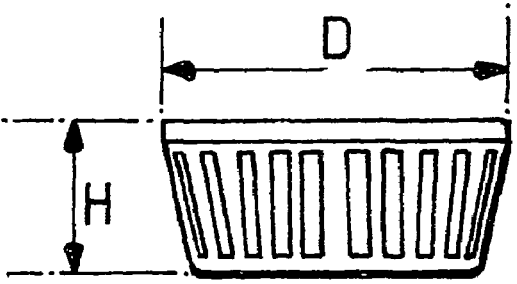
FIG. 3 is a side view of a smoke chamber for including in a smoke detector unit according to the present invention.
Figure 4:
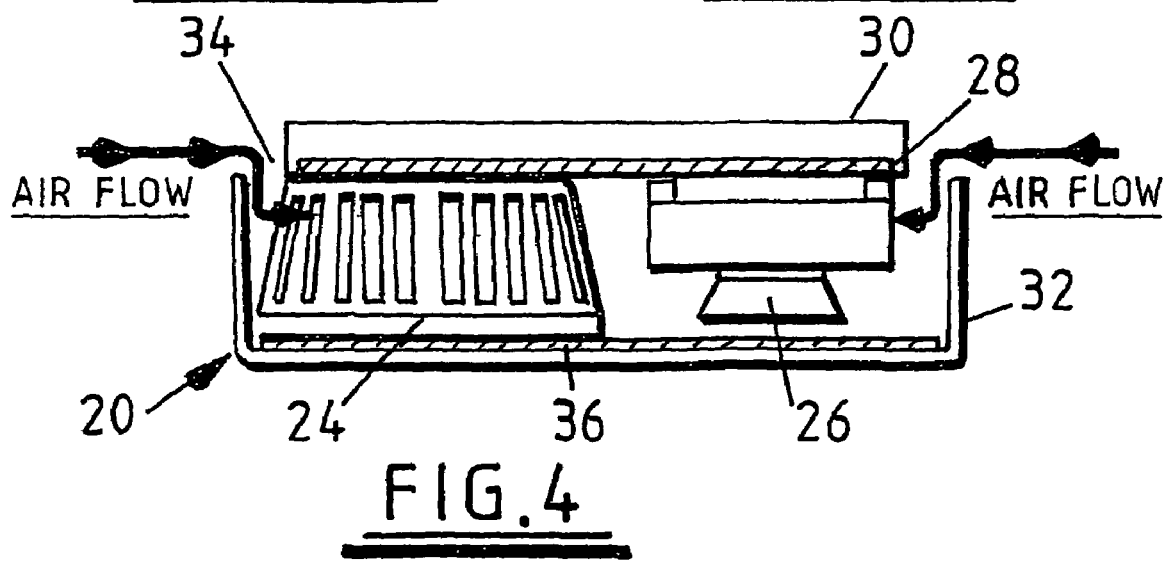
FIG. 4 is a cross sectional view of a smoke detector unit according to one embodiment of the present invention that includes the smoke chamber shown in FIG. 3.

FIGS. 3 and 4 of the accompanying drawings illustrate one embodiment of a smoke detector unit according to the present invention. The unit 20 again has a base plate 30 having a printed circuit board 28 mounted thereon and a cover 32 comprising an open-ended cylinder closed by a bridging member. An air gap 34 is provided between the upper edges of the cover and the base plate to allow air to flow into the unit (as illustrated by the arrows in FIG. 2). Additionally, a second printed circuit board (PCB) 36 is provided mounted internally on the bridging member of the cover whereby the smoke chamber 24 is mounted on this board and the alarm sounder 26 is mounted on the opposing PCB 28. The first PCB 28 is inverted with respect to the second PCB 36 such that the components provided on the first PCB extend downwardly and the components provided on the second PCB extend upwardly. Such an arrangement is important in providing a unit of smaller dimensions than has been provided prior hereto. Such an arrangement has not been envisaged previously because the large number of components that have to be placed on the boards would suggest that such an arrangement would not be feasible. Whilst simple stacking of the boards on top of each other may be considered a viable option, this type of stacking would lack the important advantage provided by the arrangement of the present invention, being the substantial reduction in size of the final article, both in width and in depth.

The provision of the components on each board facing inwardly towards each other may be expected to create difficulties with the flow of air through the unit which is required for the smoke detector housed therein to operate efficiently. However, by the provision of the stacked arrangement having the smoke detector on the lower PCB extending upwardly, the remaining components can be arranged such that an adequate air flow to the smoke detector is achieved.

Additionally, the smoke chamber 24 is provided with tapered sides whereby the chamber has the same height and is of the same diameter as the smoke chamber shown in FIGS. 1 and 2 but has a reduced diameter at the top of the chamber. In this respect, the dimensions "D" and "H" of the smoke chambers (see FIGS. 2 and 3) are critical to achieve the required performance of the smoke detector. The larger the smoke chamber, the better the performance. However, by tapering the walls of the chamber, as shown in FIG. 3, the total volume occupied by the chamber is reduced compared to that shown in FIG. 2 whilst the performance achieved is substantially the same. I.e. the tapered configuration provides an air space around the smoke detector within the unit which allows any smoke in the air to circulate and enter the smoke detector. This assists in ensuring that adequate air circulates through the inverted, stacked arrangement of the components in the unit according to the present invention. The provision of an air space in the prior art, where the smoke detector is mounted on the base, also dictated that the cover had to be larger than the base to allow air to circulate within the unit, again leading to an increase in the size of the unit.

In this manner, the design and layout of the components in the smoke detector unit shown in FIG. 4 is such that an overall reduction of at least 10% in the size of the smoke detector unit can be achieved with no deterioration in detection and airflow performance.

Furthermore, the smoke chamber now extends upwardly in a unit that is provided with an air space near to the extreme upper limits of the device. Hence, when the device is attached to a ceiling, the unit is more susceptible to smoke detection since the entry points for air to flow into the unit are higher and thus, smoke does not have to build up to such a significant level before entering the unit. Previously, the entry points have been along the sides of the housing or in the bridging member which, in use, is situated further from the ceiling.

Figure 5:
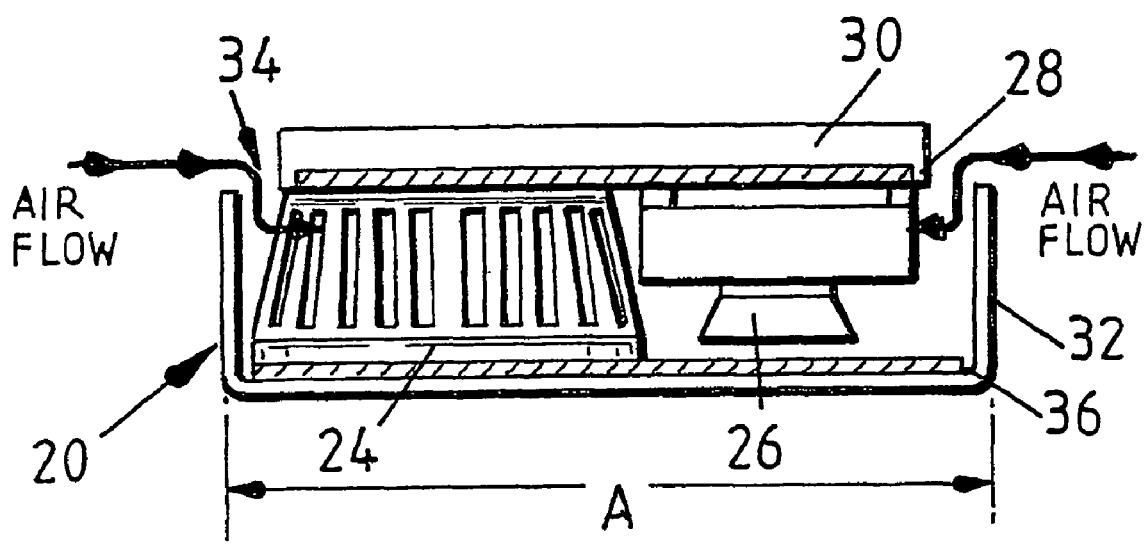
FIG. 5 is a cross sectional view of a smoke detector unit according to another embodiment of the present invention that includes the smoke chamber shown in FIG. 3.

Utilization of interconnected PCB design areas enables the unit to be miniaturized even further since the sounder, control and power supply circuits can be designed to fit on both PCBs. This enables the diameter A to be reduced by at least 16% of the diameter of a conventional smoke detector unit (see FIG. 5) when space is not required in the centre of the unit for placing additional components or for the passage of, for example, wiring for a light depending from the unit. The base can be smaller in diameter because the smoke detector is mounted at a position spaced from the base.

The arrangement of the component mounting boards and the location of the smoke detector has further implications in addition to improving the performance of the smoke detector and providing a smaller, aesthetically pleasing device for mounting on a ceiling. The stacking of the boards also enables further safety features to be included within the unit and/or allows for smoke detectors to be combined with other appliances, such as a domestic ceiling rose, in a product that is of an acceptable size to the domestic marketplace.

Figure 6:
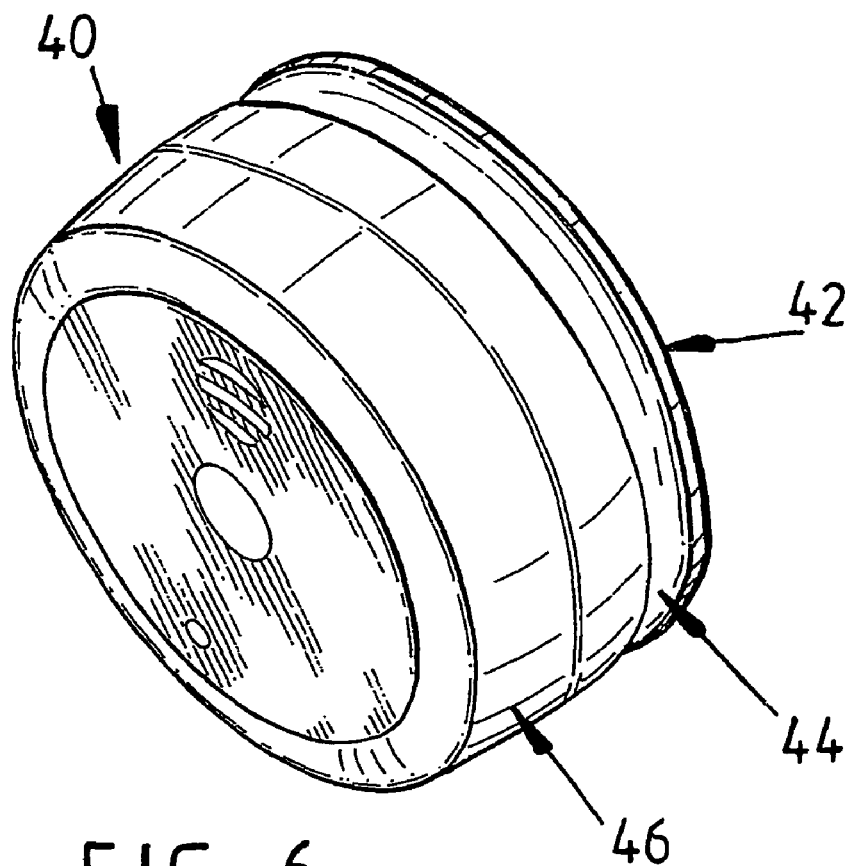
FIG. 6 is a perspective view of a smoke detector unit according to a third embodiment of the present invention.
Figure 12:
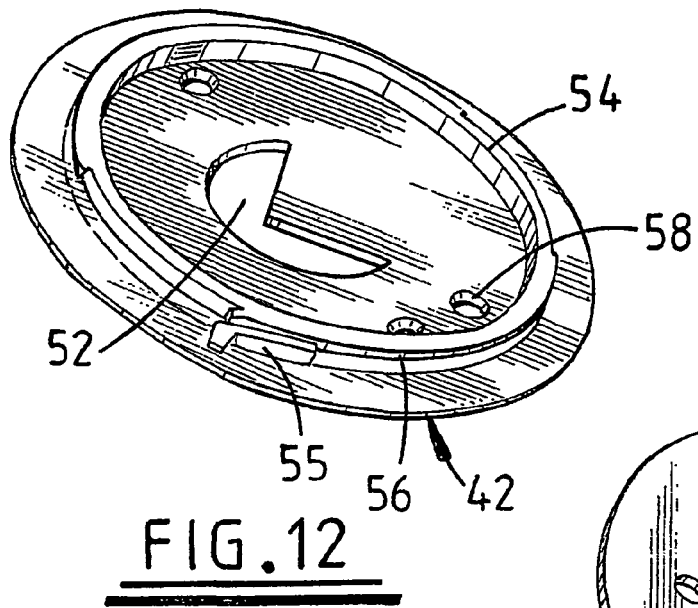
FIGS. 12 and 13 are respectively a top and bottom perspective view of the baseplate component of the smoke detector unit shown in FIG. 6.
Figure 13:
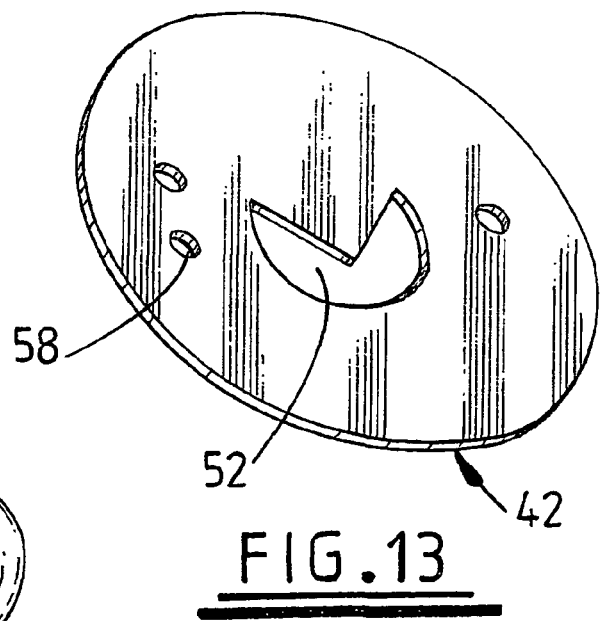
Figure 14:
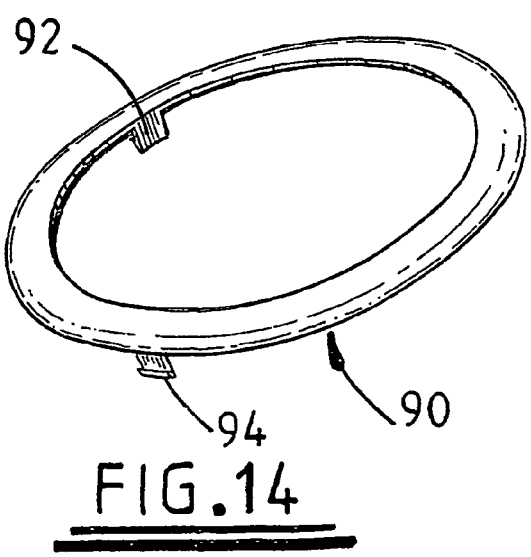
FIGS. 14 and 15 are respectively a top and bottom perspective views of yet a further component part of the smoke detector unit shown in FIG. 6.
Figure 15:
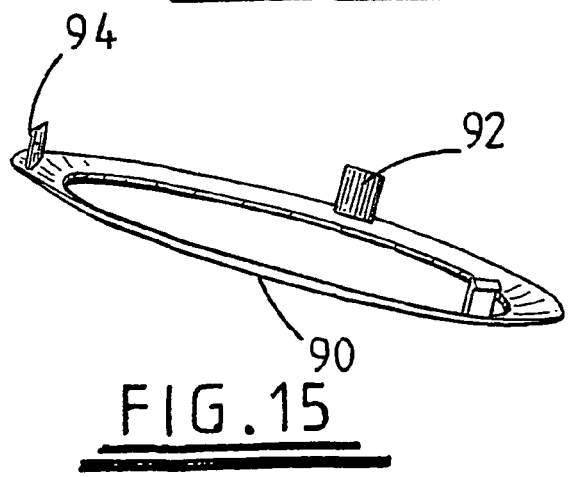

Referring to FIG. 6 of the accompanying drawings, a smoke detector unit 40 according to another embodiment of the present invention is illustrated. FIG. 6 shows the assembled unit 40 that contains the printed circuit boards, smoke chamber, sounder, control circuit and power supply. The unit comprises three main parts, a base plate 42, a mounting plate 44 and a cover 46. The base plate 42 is the part that may be attached to a surface, such as a ceiling. The mounting plate 44 supports the printed circuit boards (PCBs) carrying the functional components, such as the smoke chamber, sounder and control circuit, the PCBs being provided in a stacked arrangement on the plate. The cover 46 is then placed over and fixed to the mounting plate to encase the components. The cover and plate are then attached to the ceiling by connecting the mounting plate to the base plate.

FIGS. 7 to 15 show the various components in further detail and illustrate their interconnection. For the sake of simplicity, the internal functional components, such as the printed circuit boards, smoke chamber and sounder are omitted from these Figures to illustrate the construction of the unit. The base plate 42 (see in particular FIGS. 7, 8, 12 and 13) is flat and generally circular and has a central region 52 in the shape of a sector circle that is relieved of material. Spaced inwardly from the perimeter of the plate is an annular flange 54 that has a ridge or thread 56 extending outwardly therefrom around two regions of the flange, one of the threads terminating in a flexible male portion or retaining barb 55. A section 57 of the rim is solid. The base plate is also provided with a number of holes 58 for insertion of fixing means to enable the device to be attached to a surface, such as a ceiling.

The mounting plate 44 is a circular plate of similar dimensions to the base plate and has arcuate side walls. Three parallel locating legs 60 extend substantially perpendicularly from the plate 44 (see, in particular FIGS. 7, 8, 10 and 11). Each of the legs is provided with a small foot 62 extending inwardly. The printed circuit boards (not shown) are stacked within the boundary of the legs, a first board being located on the plate of the component and a second board being held in a spaced orientation relative to the plate near to the end of the locating legs. The smoke detector (not shown) is located on the board furthest from the plate near to the ends of the legs, extending inwardly towards the plate. The opposing side of the plate is provided with an annular flange 64 extending around two-thirds of the plate. Two opposing sections of the flange have a projecting rim 66 and a hole 68 is provided in the region of the plate that is flangeless. Additionally, the plate has holes 67 that are surrounded on one side by an open-sided box 69.

The cover part 46 of unit is generally in the form of a truncated cylinder, having slightly tapered sides 70 and a circular bridging member 72. The mouth of the cover is substantially the same diameter as the mounting plate 44. An annular recess 76 extends around the perimeter of the bridging member and has three slots 78 of a similar width to the legs of the mounting plate. Larger slots 80 are also provided at spaced apart intervals in the recess. Additionally, an aperture 82 is provided through the non-recessed part of the bridging member through which a light may shine to demonstrate that the components contained within the unit are charged and a series of slots 84 are provided that correspond to the positioning of a speaker provided within the housing.

The mounting plate and cover are fixed together by placing the ends of the legs 60 through the complimentary slots 78 provided in the annular recess 76 of the cover. The feet retain the mounting plate within the cover. A transparent ring 90 (see FIGS. 14 and 15) is placed over the recess and secured thereto by means of projections 92 having feet 94 that also pass through the slots 78. The mounting plate is then secured to the base plate by a bayonet type fixing wherein the mounting plate is pushed onto the baseplate and twisted such that the flexible male portion or retaining barb 55 of the baseplate slots into the hole 68 of the mounting plate to lock the two together. The arcuate side walls of the mounting plate provide an air gap between the plate and the top edges of the cover to allow air to flow into the unit.

As mentioned, all the components for operation of the smoke detector and any other functions the unit may perform are contained within the housing formed by the mounting plate and cover. The mounting plate is provided with holes 67 for the passage of any wiring and power may be supplied to the unit through wires that pass from the ceiling, through the central region of the baseplate into the mounting plate. A wiring connection may be provided on the outer side of the mounting plate for connection to the mains wiring. An emergency light may be contained within the unit, with the transparent ring allowing light to radiate from the interior of the unit via holes 80 in the bridging member of the cover.

Figure 16:
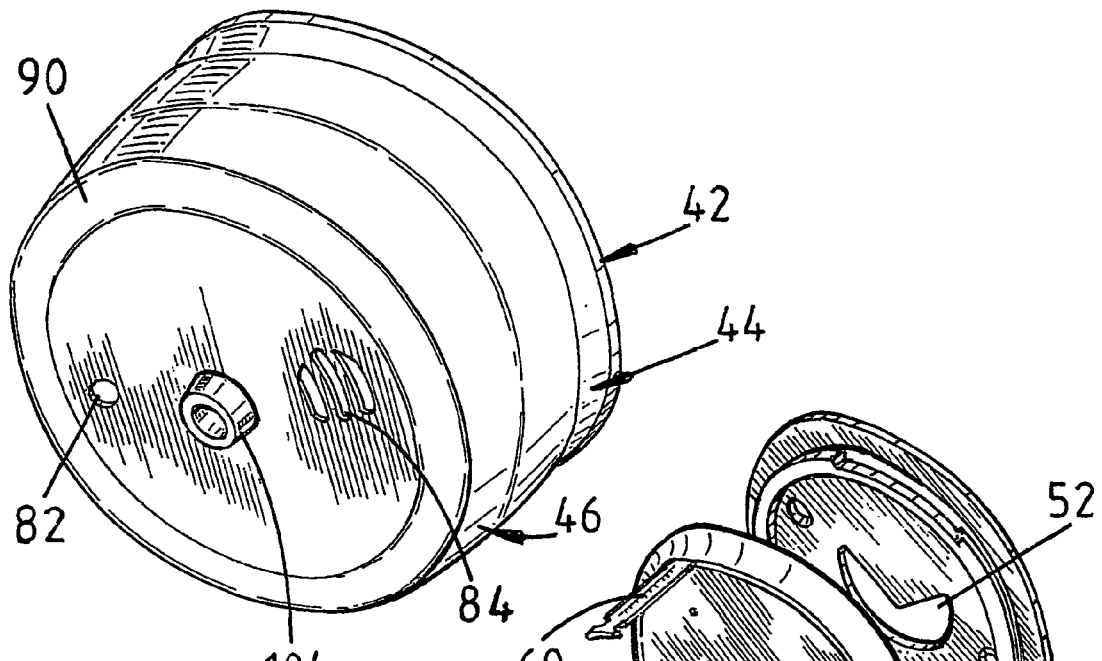
FIG. 16 is a perspective view of a smoke detector unit according to a fourth embodiment of the present invention.
Figure 17:
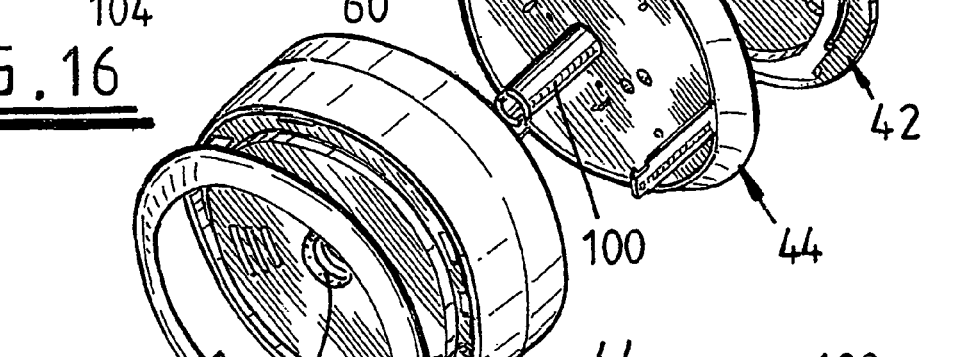
FIG. 17 is an exploded view of the smoke detector unit shown in FIG. 16.
Figure 18:
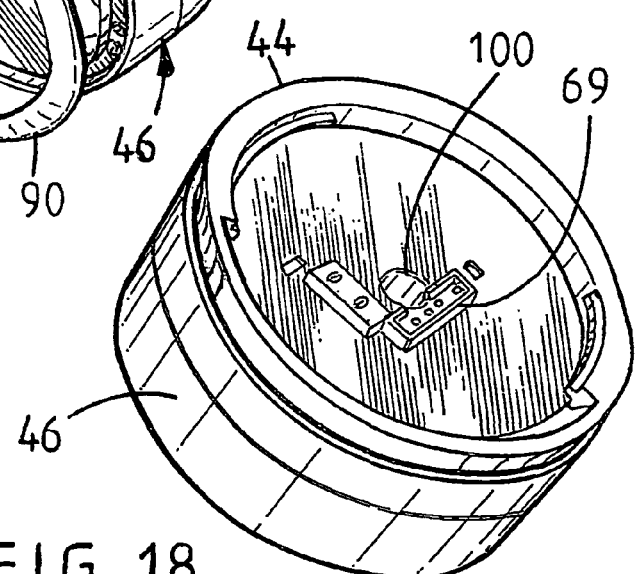
FIG. 18 is a perspective view from below of two of the components of the smoke detector unit shown in FIGS. 16 and 17, when assembled.

The unit may also be provided as part of a ceiling rose, as illustrated in FIGS. 16 to 18 of the accompanying drawings. Features that are identical to those in FIGS. 6 to 15 are given the same reference numerals and only the differences will be discussed in detail. The mounting plate 44 is provided with a hollow shaft 100 that extends from the centre thereof which is substantially parallel to the leg 60. Additionally, the bridging member of the cover has a circular hole 102 through the centre thereof and a conical shaped hollow projection 104 is attached thereto. In this manner, the standard lighting cable can pass through the centre of the device and extend through the hollow projection for attachment of a pendant light. The device mimics the appearance of a conventional ceiling rose for a pendant type light fitting.

With a conventional ceiling rose, it is common to provide the base with loop-in wiring connections and to have the cover enclose these and be provided with an aperture to accommodate the wire for the pendant drop and indeed such an arrangement may be utilized in a unit according to the present invention. However, it is to be noted that in the third and fourth embodiments of the present invention, the base 42 has no wiring connections. Instead, these are provided in the assembly comprising the mounting plate and cover, more particularly a special wiring connection is provided at the end of the mains wiring extending from the ceiling that plugs into connections projecting from the mounting plate. Hence, the provision of the cut out sector in the base plate allows mains wiring extending from the ceiling to pass therethrough to be connected to the wiring contained within the cover and mounting plate assembly.

FIG. 19 of the accompanying drawings demonstrates how the functional components for a combined ceiling rose and smoke detector may be incorporated into the unit shown in FIGS. 16 to 18. Again, identical features to those already described in relation to FIGS. 16 to 18 have been given the same reference numerals and only the additional features will be discussed in detail. The stacked printed circuit boards (PCBs) 300, 400 are provided with the necessary functional components, such as a battery 206, smoke chamber 208 and sounder 212. The smoke chamber has tapered sides and is positioned on the lower board 400 extending upwardly towards the top circuit board. A circular central region (not visible) of both PCBs is relieved of material and the space between these regions is free of components to enable the passage of the hollow shaft 100 of the mounting plate 44 through which wires may be passed. The upper PCB 300 is also provided with electrical connections in the form of pins 204.

The stacked PCBs having the appropriate components secured thereto are then fixed to the mounting plate 44 and housed within the cover 46. The cover and mounting plate may then be attached to a baseplate 42 that is fastened to the ceiling. Mains wiring from the ceiling passes through the gap 52 in the baseplate and terminates in an input socket connector 200 that may be connected to the pins 204 extending from the upper board through the mounting plate.

It is clear that the large number of components contained between the mounting plates 300, 400 would suggest that this stacked arrangement would not be possible. However, with careful orientation of the components, a fully assembled unit may be provided that is substantially the same diameter as a standard ceiling rose and has sufficient air flow through the unit.

It is to be appreciated that the ability to provide a smoke detector together with one or more other functional accessories that is substantially the same diameter as a conventional ceiling rose will enable such devices to installed in domestic housing with minimal effect on the decor of the house. It is envisaged that all rooms of the house will be provided with such units which may intercommunicate to enable an alarm to be activated in the event that a hazard, such as smoke or gas is detected in any one of the rooms. The sounder in each unit may be activated upon detection of a hazard by a unit in another room.

Units containing different types of hazard detector may be provided in different rooms. For example, a kitchen unit should contain a gas detector (such as a carbon monoxide detector) rather than a smoke detector. Additionally, it is preferable for units that are placed in childrens' rooms to be provided without a sounder such that only the emergency light is activated or, if the mains power is still operational, the mains light is switched on, rather than an audible alarm that would scare a child and lead to panic. A further feature of the unit may be to include means whereby if one of the hazard detectors contained within the housing fails, or the battery becomes flat, the mains light depending from the rose is switched on to alert occupants of the house to the fault.

Each of the units throughout a building may also be connected via the house wiring to a control box that is linked to a telephone line whereby, if one or other of the detectors in one or more of the units is activated, a preselected telephone number, such as that of the local fire authority, is dialed thus enabling the appropriate emergency service, such as the fire brigade, to be alerted to the situation and promptly arrive at the premises. The control box may enable more than one telephone number to be rung. For example, one number could be to the house owner's telephone that provides a pre-recorded message over the phone warning the owner of the activation of the alarm. The owner then has the option to prevent a signal being sent to a local emergency service by pressing a pre-selected number of the phone. If this number is not selected, the control box automatically dials the second number of the emergency service.

Furthermore, the smoke detector unit may be linked, by means of an additional wire or radio technology, to a burglar alarm panel contained within the building whereby, detection of smoke by the unit activates not only the alarm in the unit itself but also the burglar alarm. This will result in the occupants of the house being alerted to the fire by two separate alarms. Similarly, detection of an intruder by the sensors of the burglar alarm would activate both the burglar alarm and the alarm contained in the smoke detector units. The smoke detector unit may then switch on the main light in the room. This would have the effect that if a thief entered a property and activated the burglar alarm, all the lights in the property would also be switched on causing the intruder to flee.

The invention claimed is:

1. A smoke detector unit comprising a housing containing a smoke detector and at least two component mounting boards in stacked arrangement, the housing having at least one air gap, wherein one of the component mounting boards is inverted with respect to the other component mounting board with the components mutually opposing, and the detector is positioned on the lower component mounting board whereby, in use, the detector extends upwardly between the opposing component mounting boards.

2. A smoke detector unit as claimed in claim 1 wherein further functional accessories are included within the housing.

3. A smoke detector unit as claimed in claim 2 wherein the functional accessories include a sounder, control circuit and power supply.

4. A smoke detector unit as claimed in claim 3 wherein the smoke detector and sounder are provided on the opposing component mounting boards.

5. A smoke detector unit as claimed in claim 1 wherein the smoke detector is in the form of a smoke chamber having tapered sides.

6. A smoke detector unit as claimed in claim 1 wherein the components are mounted on the component mounting boards in such a manner as to allow air flow through the unit.

7. A smoke detector unit as claimed in claim 1 wherein the component mounting boards are printed circuit boards.

8. A smoke detector unit as claimed in claim 1 wherein the housing is attachable to a surface via a base plate.

9. A smoke detector unit as claimed in claim 8 wherein the housing is a truncated cylinder closed by a bridging member.

10. A smoke detector unit as claimed in claim 9 wherein one of the component mounting boards is attached to the base plate and the other component mounting board is attached to the bridging member of the housing whereby, upon fastening of the housing and base plate together, the component mounting boards are in parallel, stacked arrangement with the smoke detector located on the component mounting board attached to the bridging member.

11. A smoke detector unit as claimed in claim 8 wherein the base plate is a circular plate of similar diameter to the housing.

12. A smoke detector unit as claimed in claim 8 wherein the housing and base plate are attached to each other by means of a bayonet fixing.

13. A smoke detector unit as claimed in claim 12 wherein one of the parts is provided with a retaining barb that fits into a complimentary slot or recess provided in the other part, thereby enabling the two parts to be locked together.

14. A smoke detector unit as claimed in claim 8 wherein the air gap is provided between upper edges of the housing and the base plate to allow air to enter the interior of the housing.

15. A smoke detector unit as claimed in claim 8 wherein the housing comprises a cover and a mounting plate, the mounting plate being attachable to the base plate.

16. A smoke detector unit as claimed in claim 15 wherein the mounting plate supports the component mounting boards in a stacked arrangement, the component mounting boards having the required functional accessories thereon.

17. A smoke detector unit as claimed in claim 16 wherein the mounting plate has legs extending therefrom which allow the component mounting boards to be supported in a stacked arrangement, the smoke detector being located on the component mounting board furthest from the plate.

18. A smoke detector unit as claimed in claim 15 wherein the mounting plate is encased by the cover.

19. A smoke detector unit as claimed in claim 18 wherein an air gap is provided between the sides of the mounting plate and the upper edges of the cover.

20. A smoke detector unit as claimed in any one of the preceding claims wherein the housing is provided with a transparent region hereby an emergency light is contained within the unit.

21. A smoke detector unit as claimed in any one of the preceding claims wherein the housing includes one or more accessories selected from the group consisting of a carbon monoxide detector, a heat detector and an intruder alarm.

22. A smoke detector unit as claimed in any one of the preceding claims wherein the housing is in the form of a ceiling rose.

23. A smoke detector unit as claimed in claim 22 wherein a central hollow shaft is provided through the housing for passage of cable for a mains light that depends from the ceiling rose.

24. A smoke detector unit as claimed in claim 1, wherein the housing comprises a mounting plate, the plate being connectable to a base plate for mounting to a surface wherein electrical connections are provided in the housing and the base plate is provided with an aperture therethrough for passage of wiring to said electrical connections.

25. A smoke detector unit as claimed in claim 24 wherein the housing comprises a mounting plate and cover, the electrical connections being provided on the mounting plate and electrical wiring therefrom extends from the mounting plate into the cover and is retained therein.

26. A smoke detector unit as claimed in claim 25 wherein electrical pins or terminals extend from the mounting plate for connection to a complimentary socket provided at the ends of the wiring.

27. A combined ceiling rose and smoke detector unit comprising a housing in the form of a ceiling rose, the housing containing a smoke detector and at least two component mounting boards in stacked arrangement, the housing having at least one air gap, wherein one of the component mounting boards is inverted with respect to the other component mounting board with the components mutually opposing, and the detector is positioned on the lower component mounting board whereby, in use, the detector extends upwardly between the opposing component mounting boards.

28. A combined ceiling rose and smoke detector unit as claimed in claim 27 wherein appropriate electrical wiring for any functional accessories contained in the housing and/or for a mains light that depends from the housing is provided on or within a base plate that is attachable to the housing for connection to conventional mains wiring extending from a ceiling.

29. A combined ceiling rose and smoke detector unit as claimed in claim 27 wherein appropriate electrical wiring for any functional accessories contained in the housing and/or for a main light that depends from the housing is provided on or within the housing and the housing is attachable to the ceiling by a base plate.

30. A combined ceiling rose and smoke detector unit as claimed in claim 29 wherein a mounting plate is provided for connection to the base plate, the mounting plate supporting the component mounting boards and being encased in the housing, an intended exterior side of the mounting plate being provided with wiring connections.

31. A combined ceiling rose and smoke detector as claimed in claim 30 wherein the base plate is provided with apertures for passage of the wiring but is free from any wiring connections.

* * * * *